(12) United States Patent
Lee et al.

(10) Patent No.: US 7,186,617 B2
(45) Date of Patent: Mar. 6, 2007

(54) METHODS OF FORMING INTEGRATED CIRCUIT DEVICES HAVING A RESISTOR PATTERN AND PLUG PATTERN THAT ARE MADE FROM A SAME MATERIAL

(75) Inventors: Sung-Bok Lee, Seoul (KR); Hong-Soo Kim, Gyeonggi-do (KR); Han-Soo Kim, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 292 days.

(21) Appl. No.: 10/880,919

(22) Filed: Jun. 30, 2004

(65) Prior Publication Data

US 2005/0009332 A1    Jan. 13, 2005

(30) Foreign Application Priority Data

Jul. 8, 2003  (KR) ............... 10-2003-0046133
Apr. 8, 2006  (KR) ............... 10-2004-0024206

(51) Int. Cl.
*H01L 21/336*  (2006.01)

(52) U.S. Cl. .................. 438/266; 257/E21.66
(58) Field of Classification Search ........... 438/201, 438/257, 258, 266; 257/314–319, 369, E21.66, 257/E21.678, E21.683, E21.691
See application file for complete search history.

(56) References Cited

U.S. PATENT DOCUMENTS 6,159,799 A * 12/2000 Yu ..................... 438/257

* cited by examiner

*Primary Examiner*—David Vu
(74) *Attorney, Agent, or Firm*—Myers Bigel Sibley & Sajovec, PA

(57) ABSTRACT

An integrated circuit device is formed by forming a resistor pattern on a substrate. An interlayer dielectric layer is formed on the resistor pattern. The interlayer dielectric layer is patterned to form at least one opening that exposes the resistor pattern. A plug pattern is formed that fills the at least one opening and the plug pattern and resistor pattern are formed using a same material.

16 Claims, 19 Drawing Sheets

METHODS OF FORMING INTEGRATED CIRCUIT DEVICES HAVING A RESISTOR PATTERN AND PLUG PATTERN THAT ARE MADE FROM A SAME MATERIAL

CROSS-REFERENCE TO RELATED APPLICATIONS

This application claims the benefit of and priority to Korean Patent Application 2004-24206 filed on Apr. 8, 2004 and Korean Patent Application No. 2003-46133 filed on Jul. 8, 2003, the disclosures of which are hereby incorporated by reference as if set forth in their entireties.

BACKGROUND OF THE INVENTION

The present invention relates generally to integrated circuit devices and fabrication methods therefor, and, more particularly, to integrated circuit devices that include resistor patterns and fabrication methods therefor.

As semiconductor devices become more highly integrated, the width and spacing of conductive patterns, such as cell gate electrodes, may be reduced. If the thickness of conductive patterns is not reduced corresponding to the reduction of the width and the spacing, then it may be difficult to perform photolithographic etching to form conductive patterns. In addition, patterned conductive patterns typically have a high aspect ratio so that a subsequent process, such as a gap-fill process, may also have technical problems.

In particular, in the field of FLASH memory devices, the height of gate electrodes may increase due to a floating gate electrode. Accordingly, the above-mentioned problems may be a concern in the field of FLASH memory devices. Furthermore, the dispersion of electrical characteristics (e.g., a threshold voltage of cell transistors) may result due to coupling between two adjacent floating gate electrodes. As a result, product quality may deteriorate.

To address some of these problems, methods for reducing the thickness of the gate electrode and the floating gate electrode have been suggested. This approach, however, may have a disadvantage in that the contact resistance of a resistor may be increased.

FIG. 1 is a cross-sectional view that illustrates a conventional method for fabricating a FLASH memory device resistor. Referring now to FIG. 1, a device isolation layer 20 is formed in a predetermined region of a semiconductor substrate 10. A lower conductive pattern 30, a gate interlayer dielectric layer 40, and an upper conductive pattern 50 are sequentially stacked on the device isolation layer 20.

The upper conductive pattern 50 includes first and second conductive patterns 52 and 54, which are sequentially stacked. Conventionally, the lower conductive pattern 30 and the first upper conductive pattern 52 are formed of polysilicon, and the second upper conductive pattern 54 is formed of metallic material layer, such as tungsten silicide. The second upper conductive pattern 54 may be constructed with a control gate of a FLASH memory; therefore, the second upper conductive pattern 54 may be formed of a metallic material having a low resistivity, such as tungsten so as to reduce a signal-delay of a word line. However, the resistivity of the second upper conductive pattern 54 may be too low to form a resistor pattern having a required resistance. Thus, the lower conductive pattern 30 may be formed using polysilicon for a FLASH memory device resistor.

An interlayer dielectric layer 70 is formed on a semiconductor substrate where the upper conductive pattern 50 is formed. The interlayer dielectric layer 70 is patterned to form an opening 75 exposing a top surface of the lower conductive pattern 30. The opening 75 is formed at both sides of the lower conductive pattern 30. The opening 75 is filled with a contact plug 80 that is connected to the lower conductive pattern 30. The contact plug 80 may be formed using metallic materials, such as tungsten, and is connected to a metallic interconnection 85.

The lower conductive pattern 30 is used as a floating gate electrode in a cell array region. Thus, the thickness of the lower conductive pattern 30 may become thin as discussed above. An anisotropic etching process for forming the opening 75 may be performed using an over-etch method to reduce the likelihood of a connection failure (e.g., not-open phenomenon) between the contact plug 80 and the lower conductive pattern 30. Additionally, to simplify processing, an etching process for forming the opening 75 and an etching method for forming a bit line contact hole are performed at the same time. The thickness of the interlayer dielectric layer 70 is relatively thicker in the bit line contact hole than in the opening 75 due to the lower conductive pattern 30. Owing to this difference of thickness, the contact area between the contact plug 80 and the lower conductive pattern 30 may be changed. For example, if the opening 75 penetrates the lower conductive pattern 30 with low thickness to expose the device isolation layer 20, only the sidewalls of the contact plug 80 are in contact with the lower conductive pattern 30 (see FIG. 2). If the opening 75 does not penetrate the lower conductive pattern 30, then the top and lateral portions of the contact plug 80 are in contact with the lower conductive pattern 30 (see FIG. 3).

If different kinds of materials are used, a connection resistance between them may be highly influenced by contact area. As previously mentioned, if the contact plug 80 is formed of tungsten, and the lower conductive pattern 30 is formed of polysilicon, then the contact resistance may vary depending on a variation of contact area between the contact plug 80 and the lower conductive pattern 30. Specifically, if the contact plug 80 is formed of tungsten, a general barrier metal layer including titanium and titanium nitride may react with the polysilicon of the lower conductive pattern 30. As a result, problems may be incurred due to the formation of insulated titanium silicide. To reduce the likelihood of these problems, another mask pattern may be used in the etching process. The addition of the mask pattern may increase processing costs, however.

SUMMARY OF THE INVENTION

According to some embodiments of the present invention, an integrated circuit device is formed by forming a resistor pattern on a substrate. An interlayer dielectric layer is formed on the resistor pattern. The interlayer dielectric layer is patterned to form at least one opening that exposes the resistor pattern. A plug pattern is formed that fills the at least one opening and the plug pattern and resistor pattern are formed using a same material.

In other embodiments of the present invention, a device isolation layer is formed in the substrate to define an active region. The resistor pattern is formed on the device isolation layer.

In still other embodiments of the present invention, the resistor pattern and the plug pattern comprise polysilicon.

In still other embodiments of the present invention, patterning the interlayer dielectric layer comprises etching the interlayer dielectric layer using an etchant having an etch selectivity with respect to the resistor pattern and using an over-tech technique so as to expose the resistor pattern.

In still other embodiments of the present invention, the interlayer dielectric layer comprises silicon oxide, silicon nitride, and/or silicon oxynitride.

In still other embodiments of the present invention, a gate interlayer dielectric layer and an upper conductive layer are formed on the resistor pattern before forming the interlayer dielectric layer. The upper conductive layer and the gate interlayer dielectric layer are patterned to expose a portion of a top surface of the resistor pattern. The exposed portion of the resistor pattern corresponds to the one or more openings in the interlayer dielectric layer.

In still other embodiments of the present invention, the resistor pattern is formed by forming a device isolation layer that defines a cell array region and a resistor region in the substrate. A gate insulation layer is formed on the cell array region. A first conductive layer is formed on the gate insulation layer and the substrate. The first conductive layer is patterned to form a first conductive pattern that exposes the device isolation layer. A gate interlayer dielectric layer is formed on the first conductive layer that has one or more openings that expose a top surface of the first conductive pattern. A second conductive layer is formed on the gate interlayer dielectric layer. The second conductive layer, the gate interlayer dielectric layer, and the first conductive pattern are patterned to form a cell gate pattern and the resistor pattern in the cell array region and the resistor region, respectively.

In still other embodiments of the present invention, the first conductive layer and the plug pattern are made from a same material.

In still other embodiments of the present invention, the first conductive layer and the plug pattern comprise polysilicon.

In still other embodiments of the present invention, patterning the second conductive layer, the gate interlayer dielectric layer, and the first conductive pattern comprises patterning the second conductive layer to form an upper gate pattern that exposes the gate interlayer dielectric layer. A mask pattern is formed on the resultant structure having the upper gate pattern such that the mask pattern covers a portion of the resistor region so as to define the resistor pattern and expose the cell array region. The gate interlayer dielectric layer and the first conductive layer are sequentially etched using the mask pattern and the upper gate pattern as an etching mask.

In still other embodiments of the present invention, patterning the second conductive layer to form the upper gate pattern comprises removing the second conductive layer in the resistor region.

In still other embodiments of the present invention, the first conductive pattern is formed on an active region of the cell array region to expose the device isolation layer and cover a surface of the resistor region.

In still other embodiments of the present invention, forming the gate interlayer dielectric layer comprises forming the gate interlayer dielectric layer on a resultant structure having the first conductive pattern. The gate interlayer dielectric layer is patterned to form one or more openings that expose a top surface of the first conductive pattern.

In still other embodiments of the present invention, the second conductive layer comprises polysilicon, tungsten, tungsten silicide, cobalt silicide, and/or copper.

BRIEF DESCRIPTION OF THE DRAWINGS

FIGS. 9A to 13A and 9B to 13B are plan views that illustrate methods of forming an integrated circuit device including a resistor pattern in accordance with some embodiments of the present invention; and FIGS. 9C to 13C are cross-sectional views that illustrate methods of forming an integrated circuit device including a resistor pattern in accordance with some embodiments of the present invention.

DETAILED DESCRIPTION OF PREFERRED EMBODIMENTS

Figure 1:
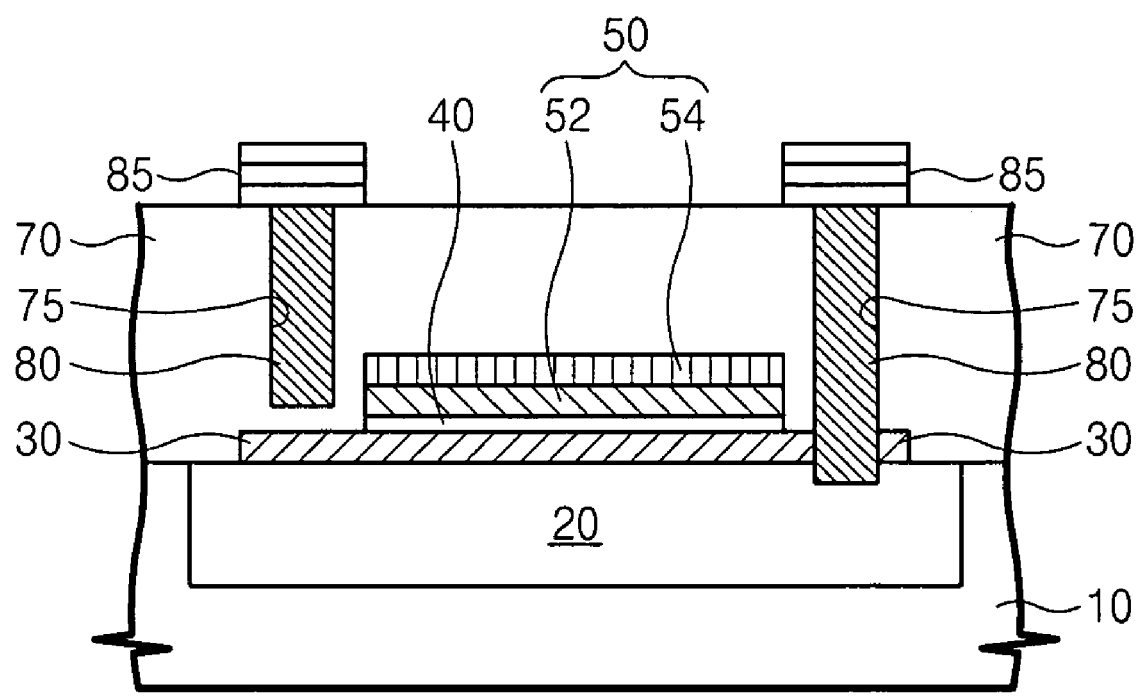
FIG. 1 is a cross-sectional view of a conventional integrated circuit device that includes a FLASH memory device resistor.
Figure 2:
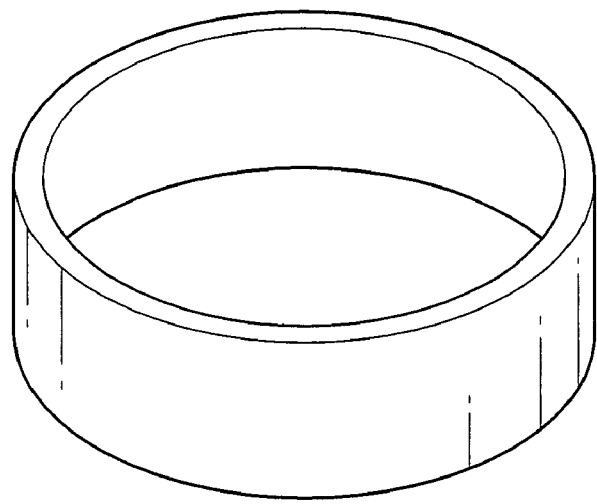
FIGS. 2 to 3 are perspective views that illustrate variations in contact area for a resistor pattern that is formed according to conventional methods.
Figure 3:
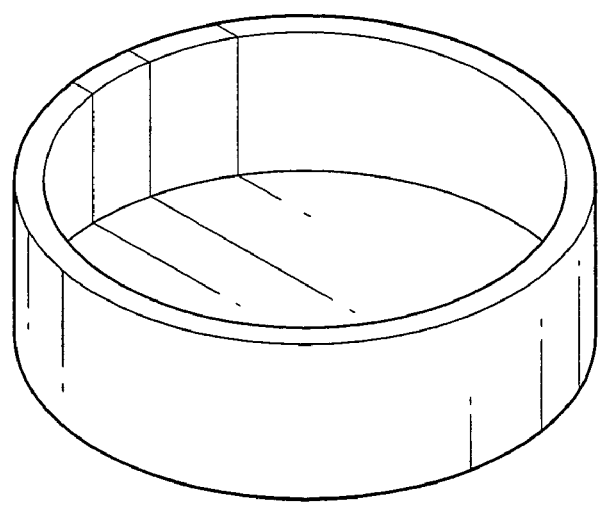

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. Each embodiment described herein also includes its complementary conductivity type embodiment.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second region, layer or section could be termed a first region, layer or section without departing from the teachings of the present invention.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a contact hole illustrated as a having squared or sharp edges will, typically, have rounded or curved features rather than the exact shapes shown in the figures. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 4:
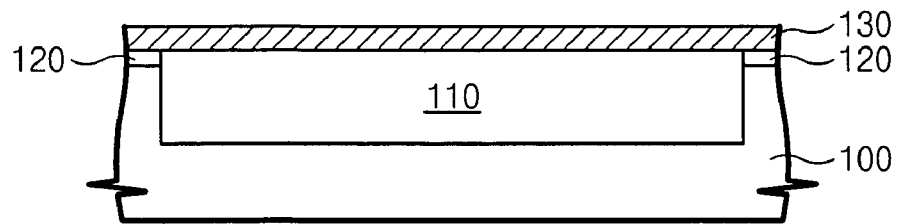
FIGS. 4 through 7 are cross-sectional views that illustrate methods of forming an integrated circuit device that includes a resistor pattern and plug pattern made from the same material in accordance with some embodiments of the present invention.

FIGS. 4 through 7 are sectional views that illustrate semiconductor devices having a resistor and methods of fabricating the same in accordance with some embodiments of the present invention. Referring now to FIG. 4, a device isolation layer 110 for defining an active region is formed at a predetermined region of a semiconductor substrate 100. The device isolation layer may be formed using a trench technique in accordance with some embodiments of the present invention. The trench technique may involve forming a trench mask pattern covering a top surface of the active region and anisotropically etching the semiconductor substrate 100 using the trench mask pattern as an etching mask. Silicon oxide film and polysilicon may be used as the trench mask pattern.

According to some embodiments of the present invention, the device isolation layer 110 defines a cell array region of a flash memory and a peripheral circuit region. A resistor region where a resistor will be formed is disposed in the peripheral circuit region.

A gate oxide layer 120 and a lower conductive layer 130 are sequentially formed on the semiconductor substrate including the device isolation layer 110. The gate oxide layer 120 may be formed by thermally oxidizing a top surface of the semiconductor substrate 100 in accordance with some embodiments of the present invention. In other embodiments of the present invention, the gate oxide layer 120 may be the silicon oxide film used as the trench mask pattern. According to some embodiment of the present invention, the lower conductive layer 130 is formed of polysilicon, and may have a thickness of about 100 to 1000 Å.

Figure 5:
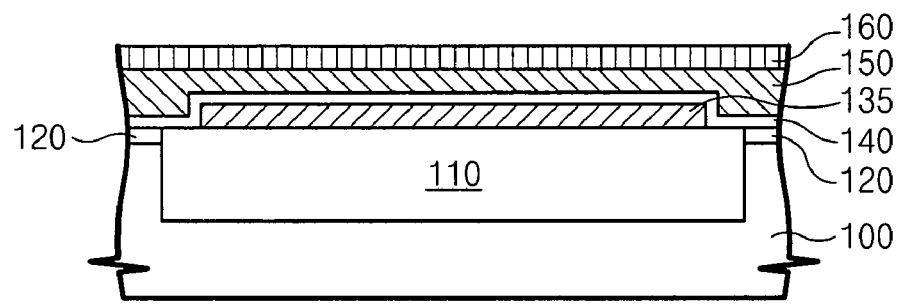

Referring now to FIG. 5, the lower conductive layer 130 is patterned to form a resistor pattern 135 disposed on the device isolation layer 110. After that, a gate interlayer dielectric layer 140 is formed on the surface of the semiconductor substrate including the resistor pattern 135. The gate interlayer dielectric layer 140 may comprise a silicon oxide layer, a silicon nitride layer, and/or a silicon oxide layer, which are sequentially stacked.

According to some embodiments of the present invention, the thickness of the silicon oxide layer, the silicon nitride layer and the silicon oxide layer are approximately 45 Å, 70 Å and 85 Å, respectively. The thickness of these material layers can be changed in accordance with various embodiments of the present invention.

An upper conductive layer is formed on the semiconductor substrate 100 including the gate interlayer dielectric layer 140. The upper conductive layer may be formed of a conductive material having an etch selectivity with respect to the gate interlayer dielectric layer 140. For example, the upper conductive layer may be polysilicon, tungsten, tungsten silicide, cobalt silicide, and/or copper. The upper conductive layer may comprise first and second upper conductive layers 150 and 160. In this case, the first upper conductive layer 150 may be polysilicon, and the second upper conductive layer 160 may be tungsten silicide.

According to some embodiments of the present invention, the gate interlayer dielectric layer 140 may be formed on the lower conductive layer 130 without patterning the lower conductive layer 130 to form the resistor pattern 135. In accordance with these embodiments, before forming the upper conductive layer, the gate interlayer dielectric layer 140 is patterned to expose a predetermined region of the lower conductive layer 130. Open regions for exposing the lower conductive layer 130 may be formed in the cell array region and the resistor region.

Figure 6:
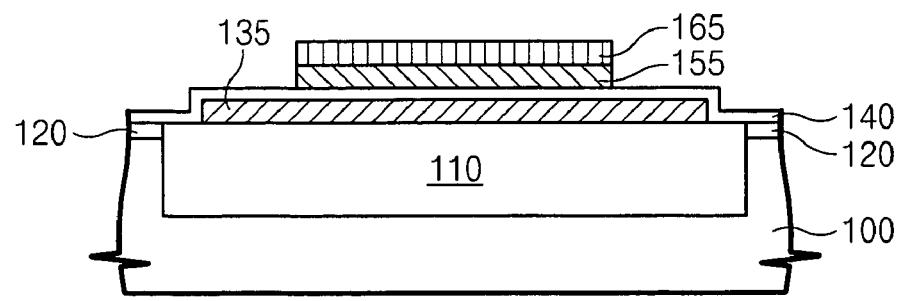

Referring now to FIG. 6, until a top surface of the gate interlayer dielectric layer 140 is exposed, the upper conductive layers 150 and 160 are patterned to form an upper conductive pattern disposed on the resistor region. The upper conductive pattern comprises a first upper conductive pattern 155 and a second upper conductive pattern 165, which are sequentially stacked. The upper conductive patterns 150 and 160 may be patterned using an anisotropic etching method having an etch selectivity with respect to the gate interlayer dielectric layer.

The gate interlayer dielectric layer 140, the first upper conductive pattern 155, and the second upper conductive pattern 165 may be used in some embodiments of the present invention for fabricating a flash memory device having a resistor. Embodiments without these layers may be used to form semiconductor devices other than flash memory devices, for example.

Figure 7:
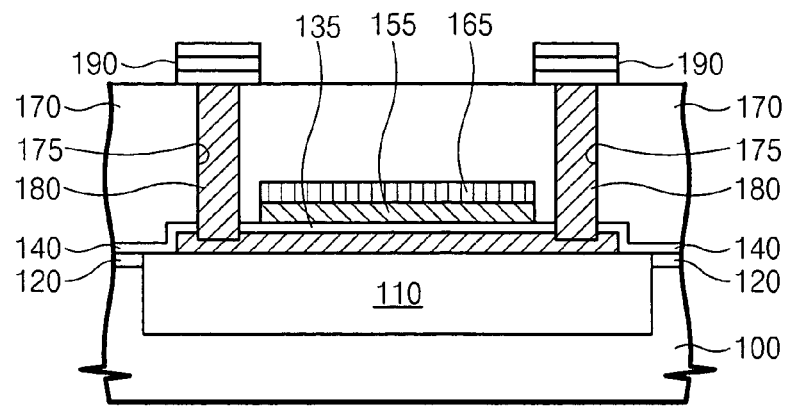

Referring now to FIG. 7, an interlayer dielectric layer 170 is formed on a semiconductor substrate including the upper conductive patterns 155 and 165. The interlayer dielectric layer 170 may be formed of a silicon oxide layer, a silicon nitride layer, and/or a silicon oxynitride layer. The interlayer dielectric layer 170 is patterned to form openings 175 for exposing the resistor pattern 135. The openings 175 may be formed at both sides of the resistor pattern 135.

A plug conductive layer filling the openings 175 is formed on the surface of the interlayer dielectric layer 170. The plug conductive layer may be formed of the same materials as the resistor pattern 135. The plug conductive layer is planarizingly etched until a top surface of the interlayer dielectric layer 170 is exposed. Accordingly, a plug pattern filling the opening 175 is formed. The planarizing etch may be performed using a chemical mechanical polishing (CMP) or an etchback. An upper interconnection is formed on the interlayer dielectric layer 170 to be connected to the plug pattern 180.

According to some embodiments of the present invention, the opening 175 may be formed by etching the interlayer dielectric layer 170 using an etchant having an etch selectivity with respect to the resistor pattern 135. If the resistor pattern 135 is not exposed, then connection failure problems may occur. Therefore, an over-etch method may be used in forming the opening 175.

As discussed above in the background section, if the opening 175 is formed using the over-etch method, the device isolation layer 110 may be exposed due to a reduced thickness of the resistor pattern 135. Conventionally, the connection area may be changed by exposing the device isolation layer 110. As a result, a resistance measured in the resistor pattern 135 may be non-uniform depending on a position of a semiconductor substrate. This problem may be related to the increase of a contact resistance at the interfaces. In other words, the reason for this is that the resistor pattern 135 may be made from a different material than the plug pattern 180.

According to some embodiments of the present invention, the plug pattern 180 may be formed of the same material(s) as the resistor pattern 135, for example, polysilicon. As a result, it is possible to reduce a contact resistance between different kinds of materials, thereby reducing non-uniformity of resistance depending on a variation of above contact area.

Figure 8:
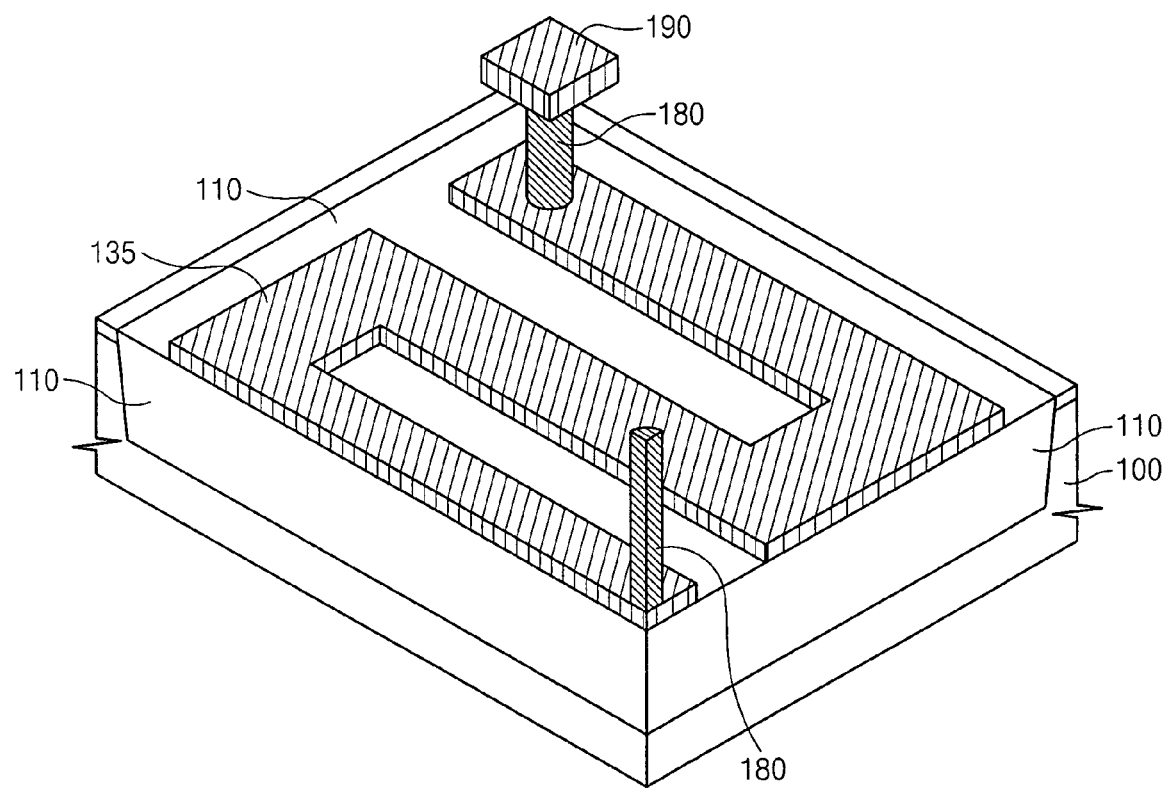
FIG. 8 is a perspective view that illustrates a resistor pattern in accordance with some embodiments of the present invention.

FIG. 8 is a perspective view that illustrates a semiconductor device resistor according to some embodiments of the present invention. Referring now to FIG. 8, a device isolation layer 110 defining an active region is disposed on a predetermined region of a semiconductor substrate 100. The device isolation layer 110 may be formed by a trench technique and may be formed of silicon oxide.

A resistor pattern 135 is disposed on the device isolation layer 110. To have a predetermined resistance, the resistor pattern 135 may have a predetermined length. In highly integrated semiconductor devices, it may be desirable to reduce an occupation area of the resistor pattern 135. Accordingly, in some embodiments of the present invention, the resistor pattern 135 may be formed to have a zigzag shape. The resistor pattern 135 may be formed of polysilicon in accordance with some embodiments of the present invention. The thickness of the resistor pattern may be about 100 to 1000 Å.

Predetermined plug patterns 180 are disposed on the resistor pattern 135. The plug pattern 180 is connected to a predetermined interconnection 190 that crosses over the plug pattern 180. The plug patterns 180 are electrically connected to both ends of the resistor pattern 135. The plug pattern 180 may be in contact with the resistor pattern 135 or penetrate the resistor pattern 135 to be in contact with the device isolation layer 110 according to various embodiments of the present invention. To lessen the increase in contact resistance, the plug pattern 180 may be formed using the same materials as the resistor pattern 135. Thus, according to some embodiments of the present invention, both the plug pattern 180 and the resistor pattern 135 may be formed of polysilicon.

Figure 9A:
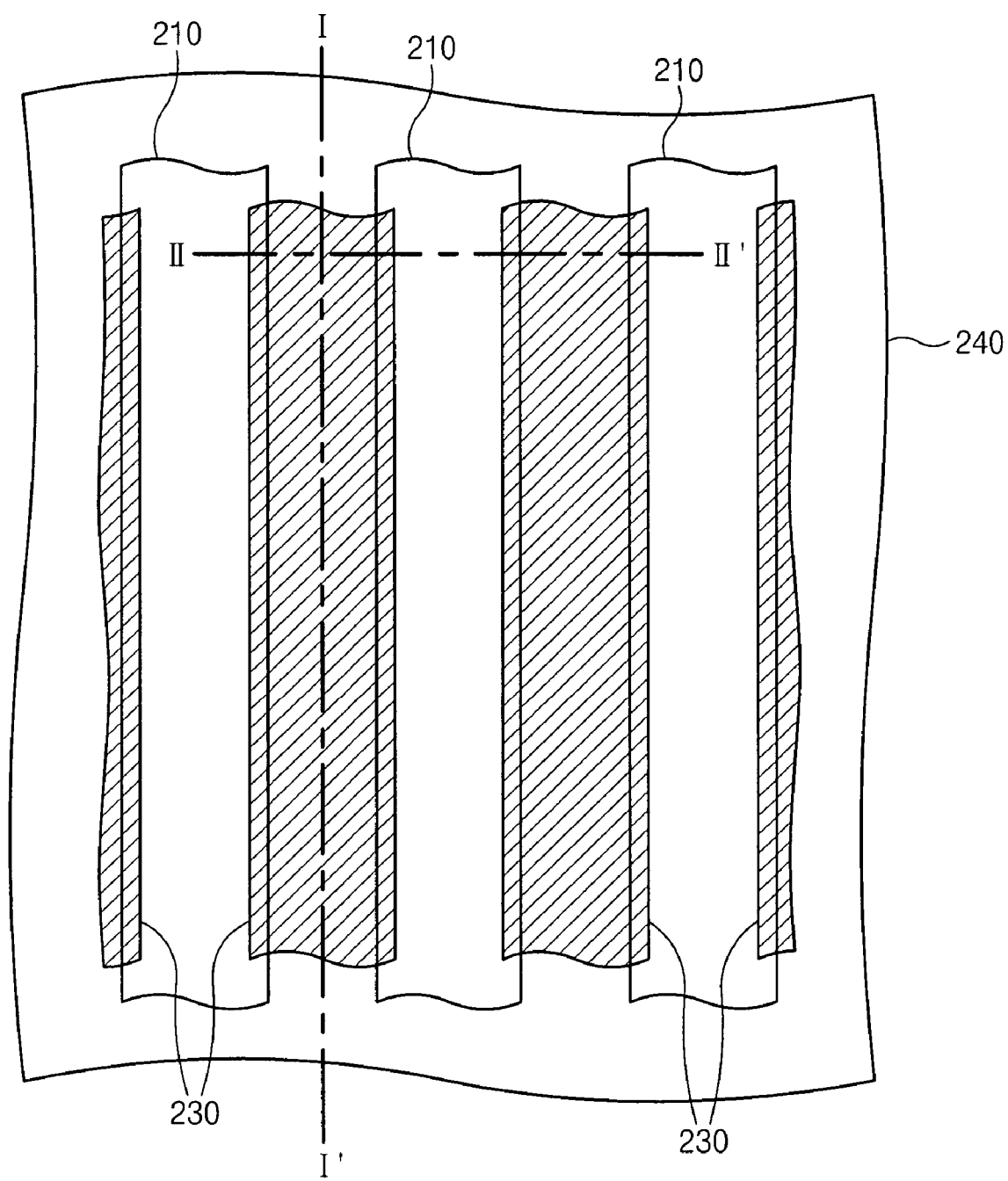
Figure 9B:
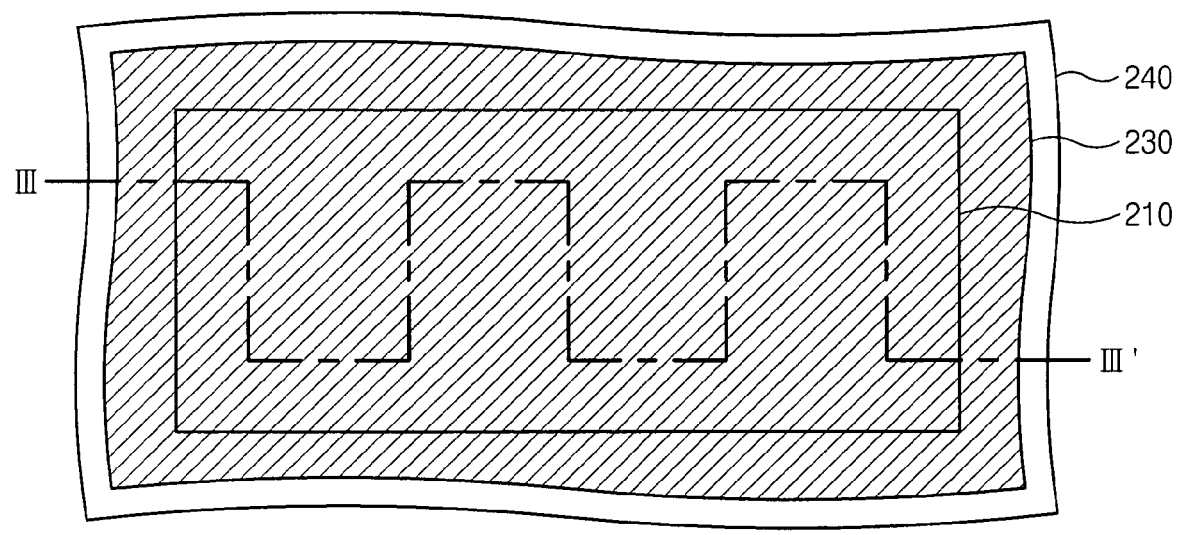
Figure 9C:
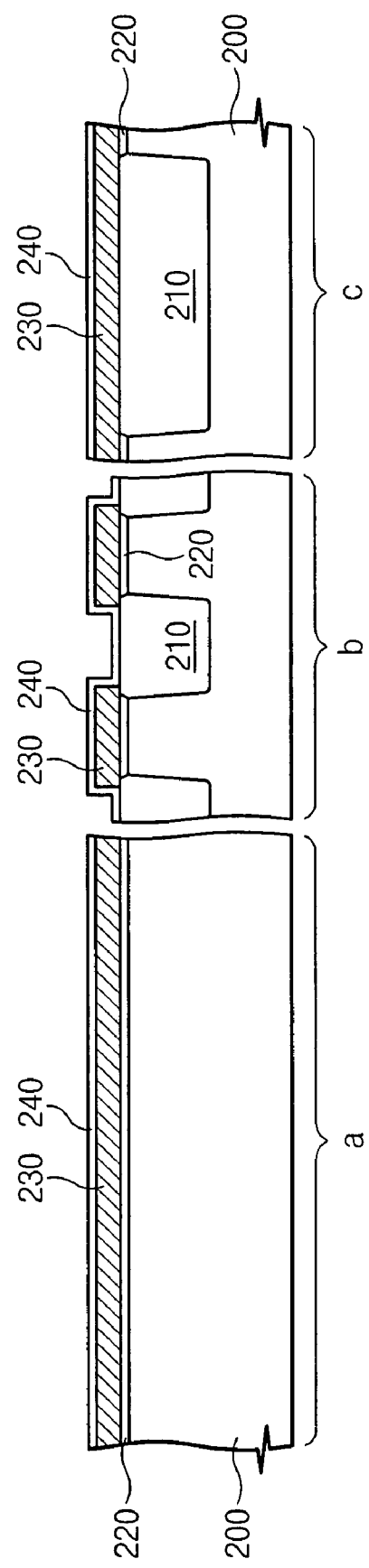

Referring now to FIGS. 9A, 9B and 9C, a device isolation layer 210 defining active regions is formed on a semiconductor substrate 200. The device isolation layer may divide the semiconductor substrate 200 into a cell array region, a peripheral circuit region, and a resistor region. FIGS. 9A to 13A are plan views showing the cell array region, FIGS. 9B to 13B are plan views showing the resistor region, and FIGS. 9C to 13C are cross-sectional views showing sections of the cell array and resistor regions. In particular, a and b regions of FIGS. 9C to 13C are cross-sectional views taken along dotted lines I–I' and II–II' of FIGS. 9A to 13A, respectively, and c regions are cross-sectional views taken along dotted lines III–III' of FIGS. 9B to 13B. The resistor region means a predetermined region with wide area in the peripheral region where a resistor is formed.

A gate insulation layer 220 is formed on the active region. The gate insulation layer 220 may be silicon oxide, which is formed by thermally oxidizing a top surface of the semiconductor substrate 200. In addition, the gate insulation layer 220 may comprise a silicon nitride layer, a silicon oxynitride layer, and/or a tungsten nitride layer.

A first conductive layer is formed on the resultant structure having the gate insulation layer 220. As discussed above, as semiconductor device become more highly integrated, the thickness of the first conductive layer may be reduced. In accordance with some embodiments of the present invention, the first conductive layer is formed to have a thickness of about 300 to 1000Å. In addition, the first conductive layer may be formed of polysilicon.

The first conductive layer is patterned to form a first conductive pattern 230 exposing the device isolation layer 210 and covering the active region in the cell array region. That is, the first conductive pattern 230 is formed in parallel to the active region and the device isolation layer 210 in the cell array region. According to some embodiments of the present invention, the first conductive layer is not patterned in the resistor region. Accordingly, the first conductive pattern 230 covers the surface of the resistor region.

A gate interlayer dielectric layer 240 is formed. The gate interlayer dielectric layer 240 conformally covers a resultant structure having the first conductive pattern 230. The gate interlayer dielectric layer 240 may comprise a silicon oxide layer, a silicon nitride layer, and/or a silicon oxide layer, which are sequentially stacked.

Figure 10A:
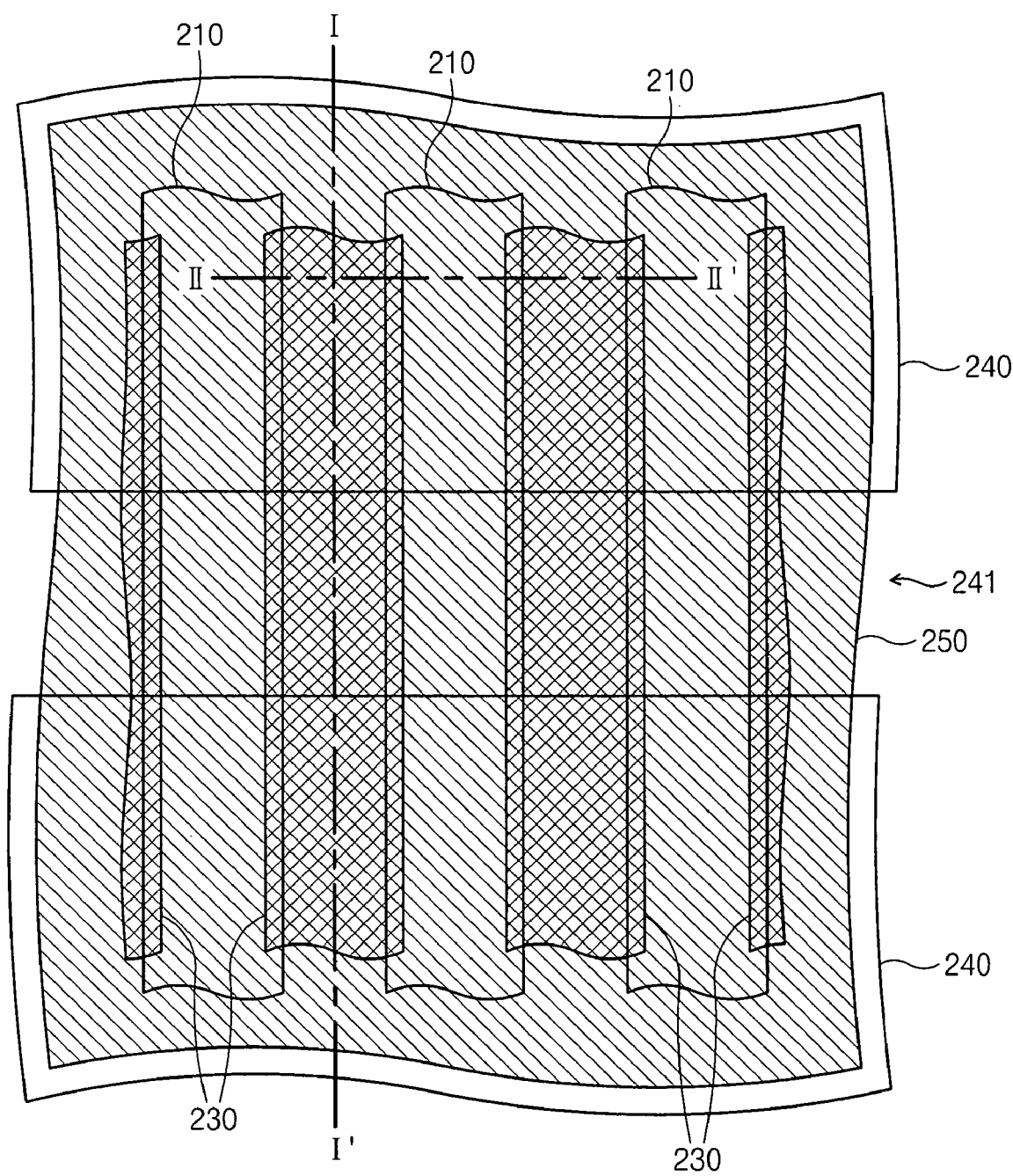
Figure 10B:
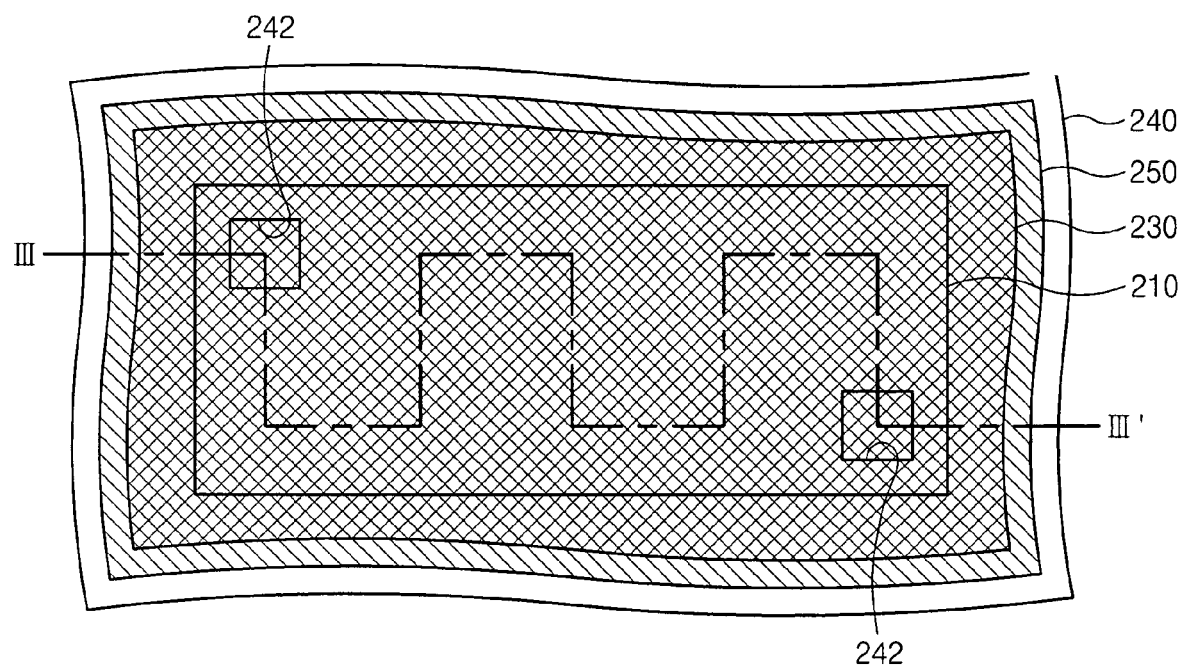
Figure 10C:
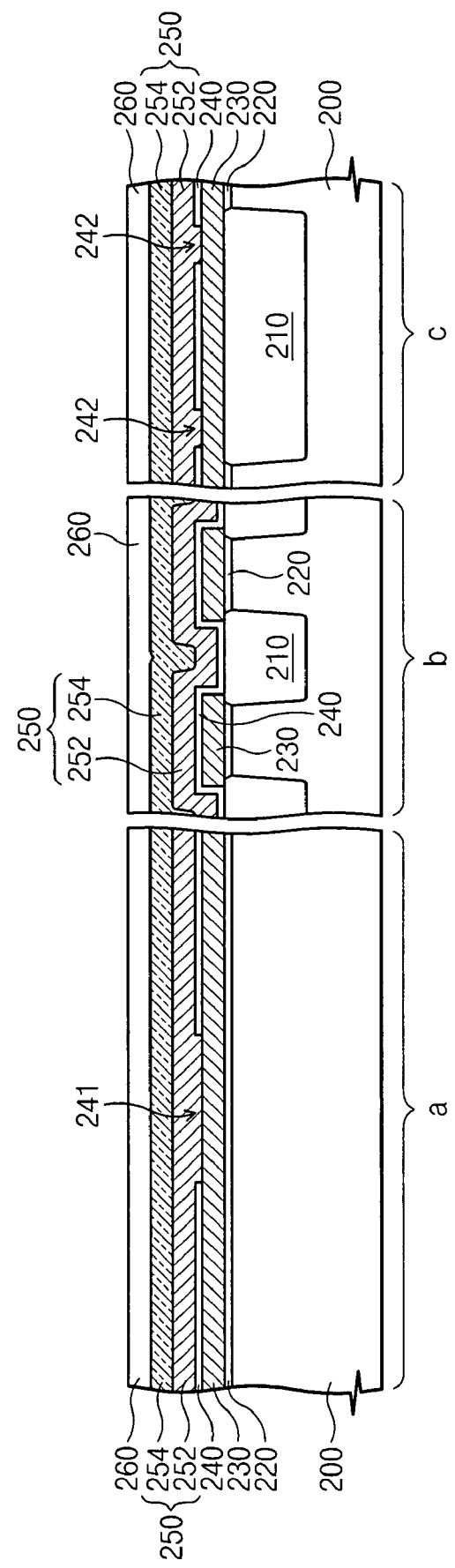

Referring now to FIGS. 10A, 10B and 10C, the gate interlayer dielectric layer 240 is patterned to form openings exposing a predetermined region of the first conductive pattern 230. The openings may be divided into a first opening 241 formed in the cell array region and a second opening 242 formed in the resistor region. The first opening 241 defines a region where a select transistor is formed in a subsequent process. Preferably, the first opening 241 is formed so as to cross over a plurality of device isolation layers 210. The second opening 242 defines a position of an electrode connected to both ends of a resistor pattern. Therefore, a position of the second opening 242 depends on a shape of the resistor pattern, and generally is formed at both ends of the resistor pattern.

A second conductive layer 250 is formed on a resultant structure having the openings 241 and 242. The second conductive layer 250 may comprise a lower second conductive layer 252 and an upper second conductive layer 254, which are sequentially stacked. The upper second conductive layer 254 may have a low resistivity in comparison with the lower second conductive layer 252. The lower second conductive layer 252 may comprise polysilicon, and the upper second conductive layer 254 may comprise tungsten, tungsten silicide, and/or cobalt silicide.

The gate interlayer dielectric layer 240 is disposed between the first conductive pattern 230 and second conductive layer 250. The first conductive pattern 230 is connected to the second conductive layer 250 through the first and second openings 241 and 242.

A capping insulation layer 260 may be further formed over the second conductive layer 250. The capping insulation layer 260 may comprise a silicon nitride layer, a silicon oxide layer, and/or a silicon oxynitride layer.

Figure 11A:
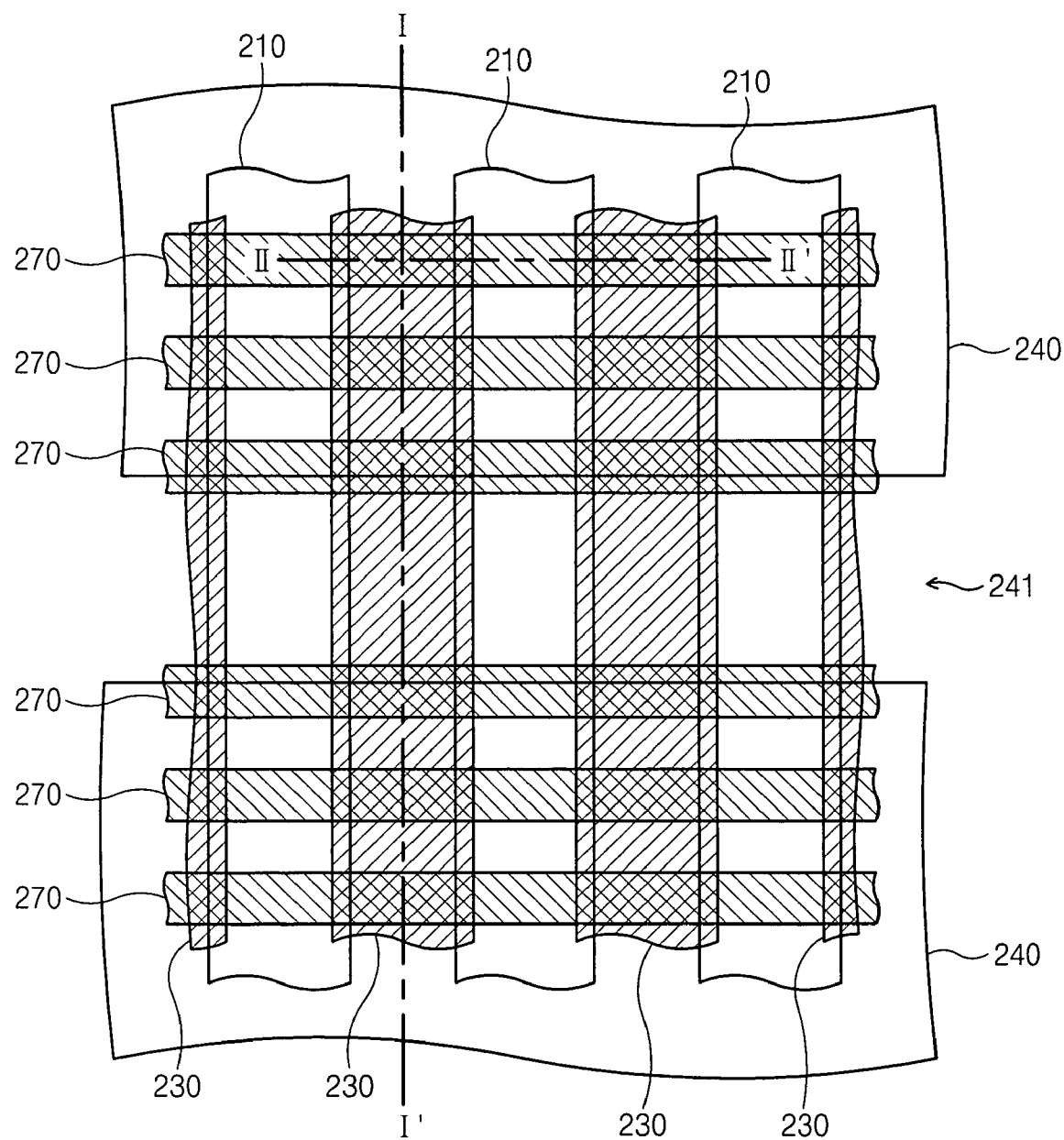
Figure 11B:
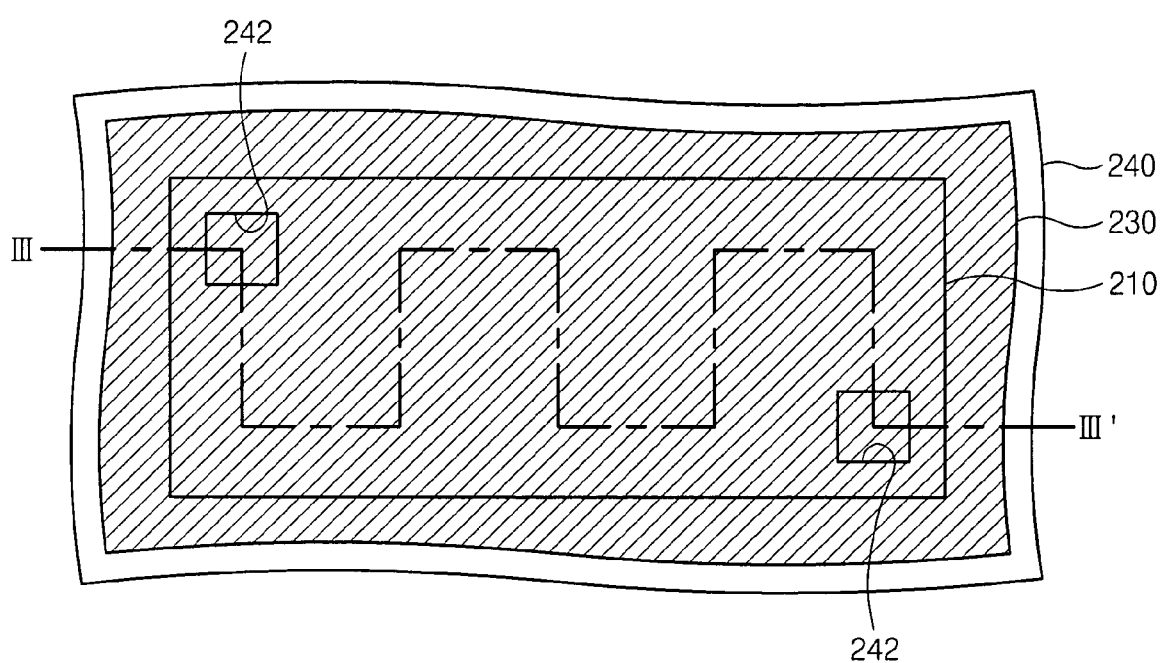
Figure 11C:
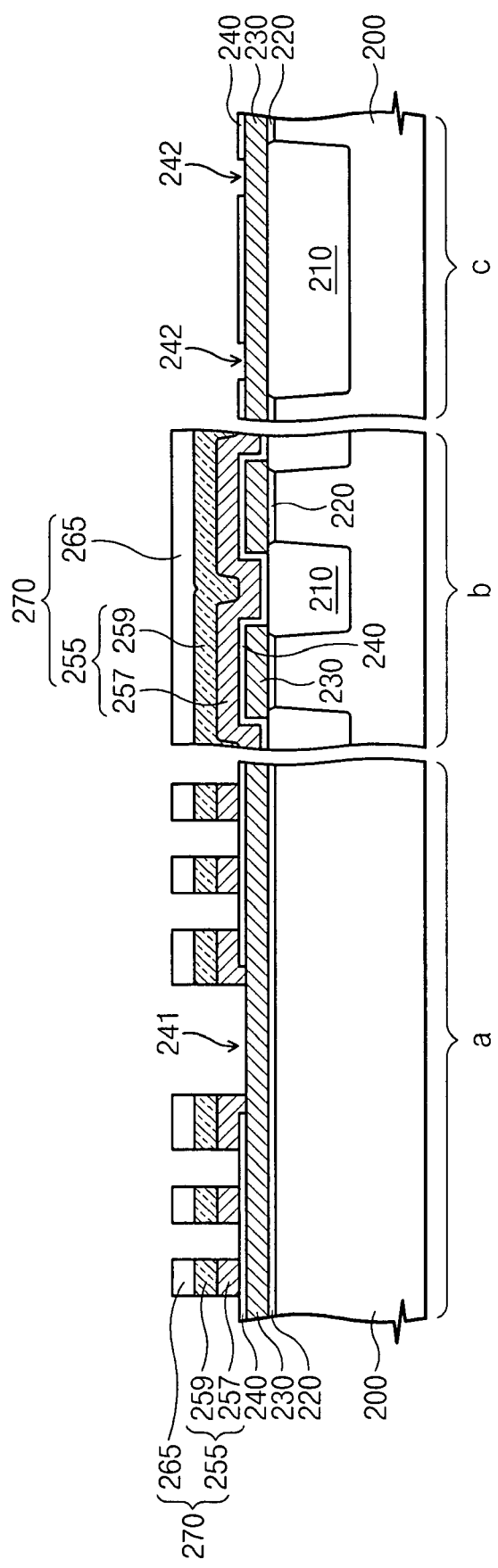

Referring to now FIGS. 11A, 11B and 11C, a first mask pattern (not shown) is formed on the capping insulation layer 260. The capping insulation layer 260 and second conductive layer 250 are sequentially patterned using the first mask pattern as an etching mask to form an upper gate pattern 270 exposing the gate interlayer dielectric layer 240. The upper gate pattern 270 comprises a second conductive pattern 255 and a capping insulation pattern 265, which are sequentially stacked. The second conductive pattern 255 comprises a lower second conductive pattern 257 and an upper second conductive pattern 259, which are sequentially stacked.

The first mask pattern perpendicularly crosses the device isolation layer 210 and the active region in the cell array region. Accordingly, the upper gate pattern 270 is located perpendicular to the device isolation layer 210 and the active region in the cell array region. In addition, according to some embodiments of the present invention, the first mask pattern exposes the top surface of the capping insulation layer 260 in the resistor region. Accordingly, during a patterning process, the capping insulation layer 260 and the second conductive layer 250 are removed from the resistor region. As a result, the upper gate pattern 270 is not formed in the resistor region 270. The first mask pattern may be a photoresist layer formed using a photolithography technique and is removed after forming the upper gate pattern 270.

Figure 12A:
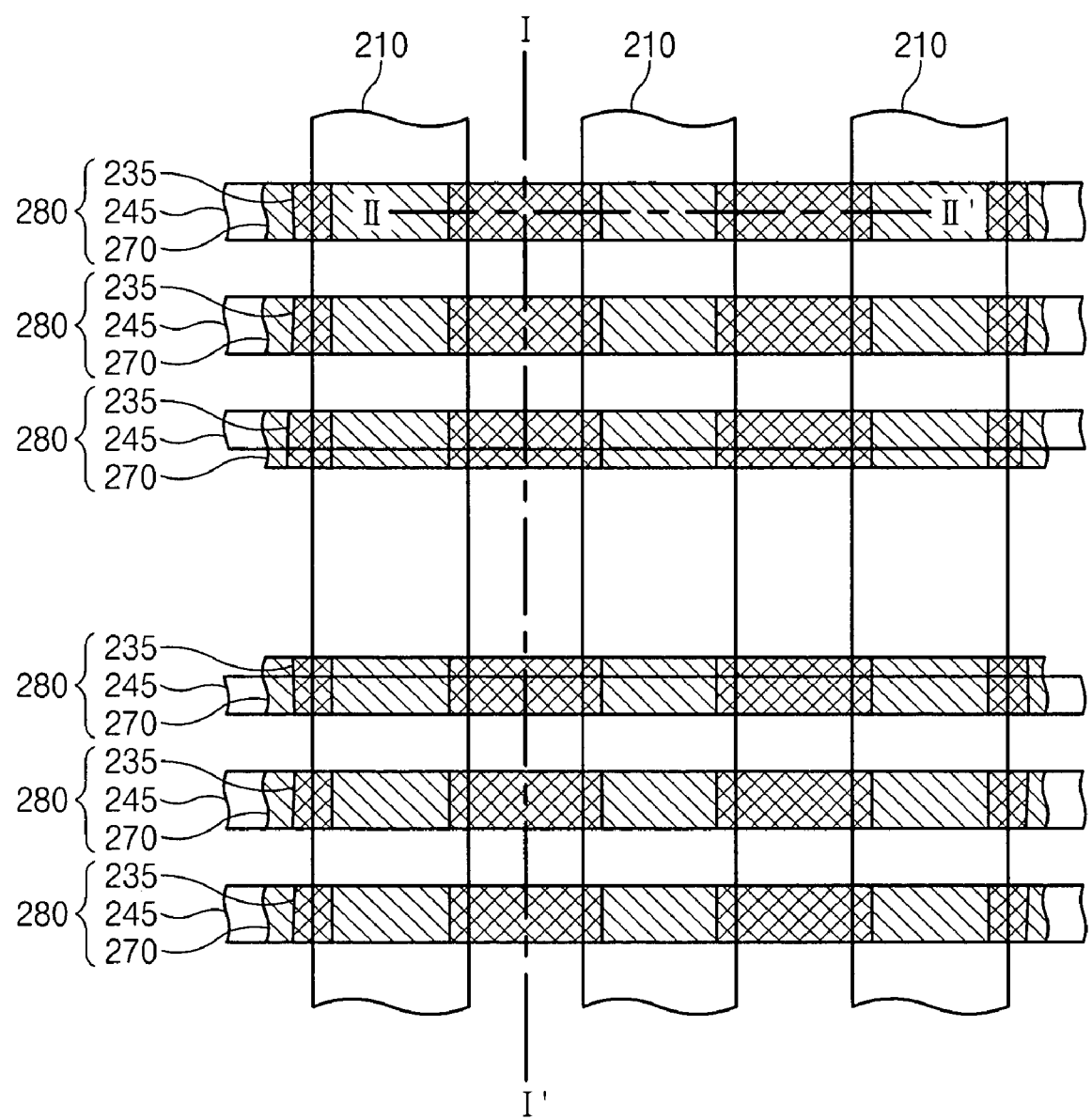
Figure 12B:
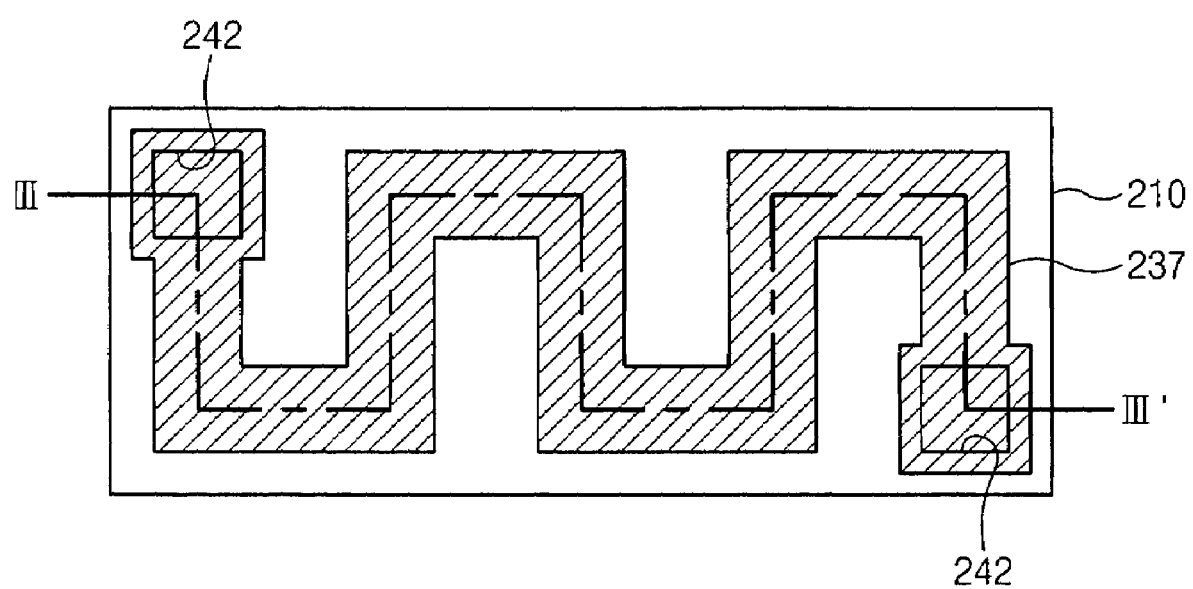
Figure 12C:
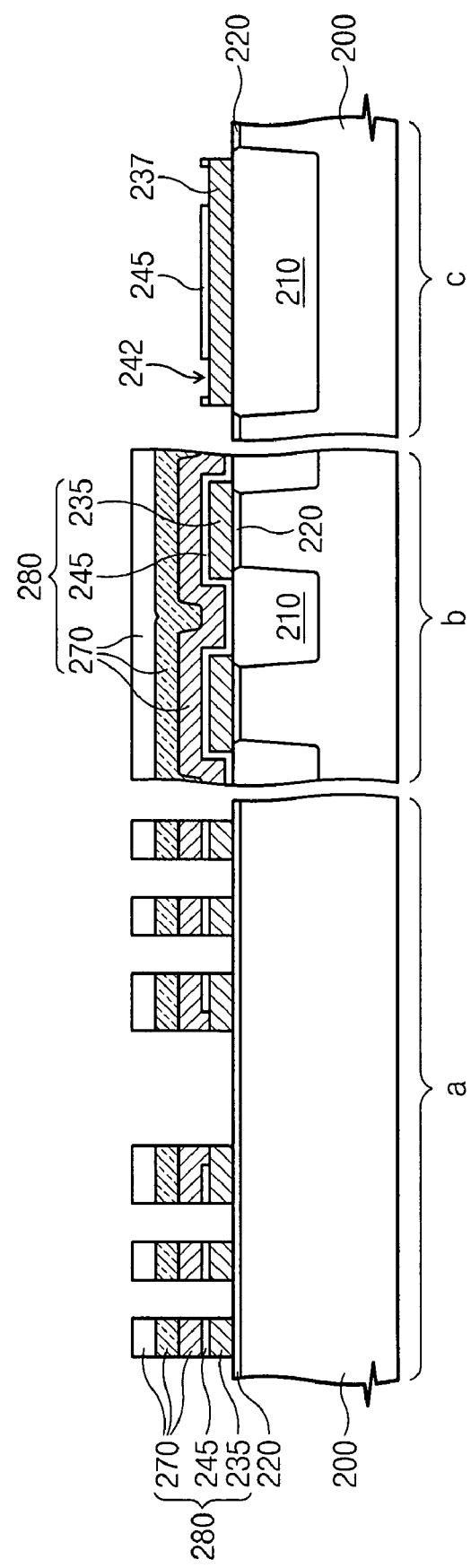

Referring now to FIGS. 12A, 12B, and 12C, a second mask pattern (not shown) is formed on a resultant structure where the first mask pattern is removed. The first conductive pattern 230 is etched using the second mask pattern as an etch mask. In accordance with some embodiments of the present invention, this etching process uses an etchant capable of etching the first conductive pattern 230 rather than the capping insulation layer 265 and the second mask pattern. Accordingly, the upper gate pattern 170, including the capping insulation pattern 265, may act as an etching mask in the etching process at the cell array region. Thus, a lower gate pattern 235 for exposing the gate insulation layer 220 is formed under the upper gate pattern 270. The lower gate pattern 235 and the upper gate pattern 270 comprise a cell gate pattern 280.

The second mask pattern is used as an etching mask for patterning the first conductive pattern 230 in the resistor region. The second mask pattern may linearly cover a predetermined region of the resistor region. Accordingly, a resistor pattern 237 is formed under the second mask pattern in the resistor region. The lower gate pattern 235 is formed during an etching process for forming the resistor pattern 237. That is, the lower gate pattern 235 and the resistor pattern 237 are formed simultaneously. To electrically connect the resistor pattern 237 and an external terminal, the second mask pattern defining the resistor pattern 237 is formed so as to cover the second opening 242.

According to some embodiments of the present invention, the lower gate pattern 235 may be used as a floating gate electrode of a FLASH memory device. In addition, in a NAND FLASH memory device, the lower gate pattern 235 is connected to the upper gate pattern 270 in a predetermined region so that it may comprise a gate electrode of a select transistor. For this, the first opening 241, as shown in FIGS. 10A and 10C, may expose a top surface of the first conductive pattern 230 in a region where the select transistor will be formed. The second mask pattern may comprise a photoresist layer formed using a photolithography technique. In addition, the second mask pattern may be removed after removing the resistor pattern 237.

Figure 13A:
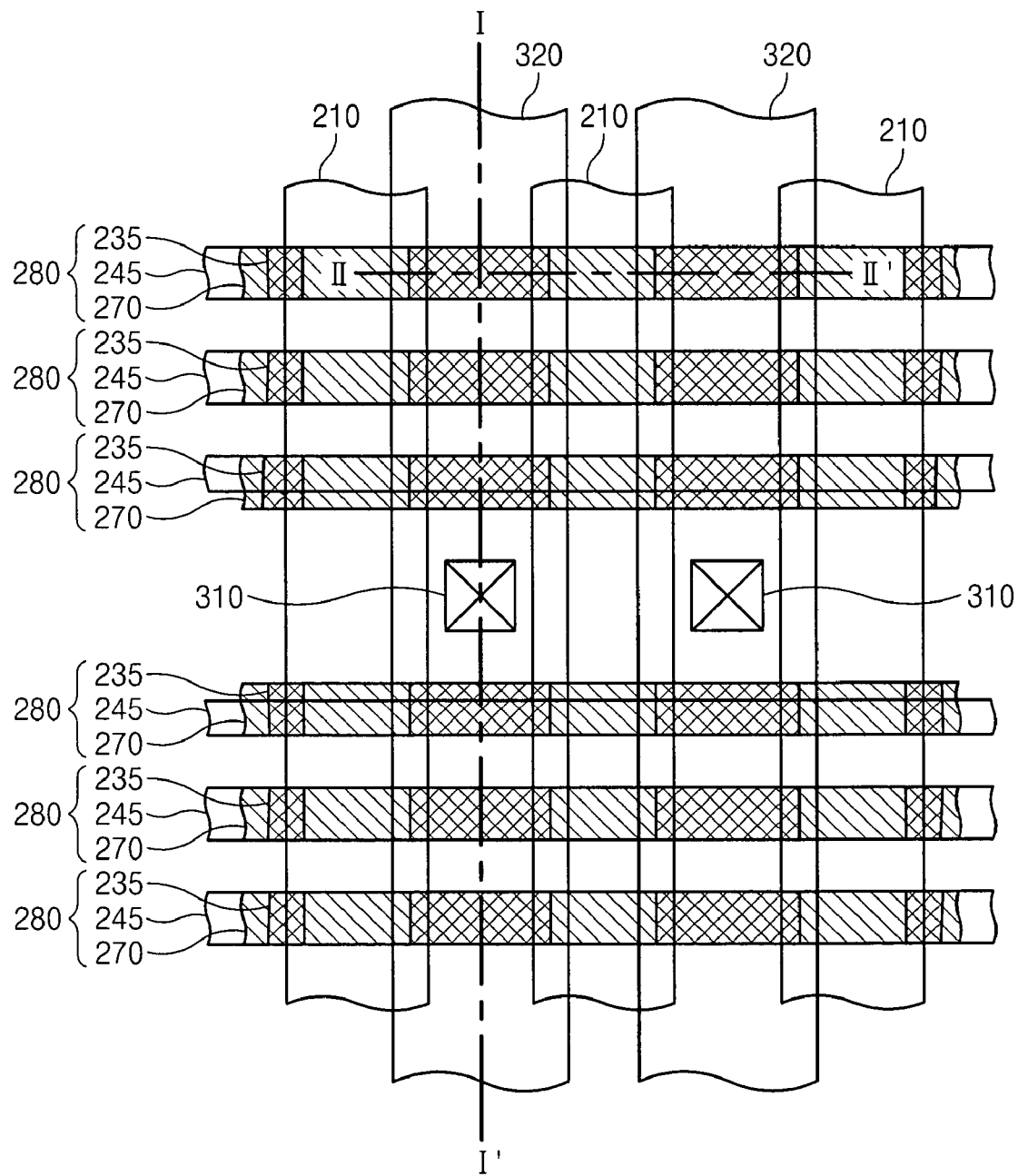
Figure 13B:
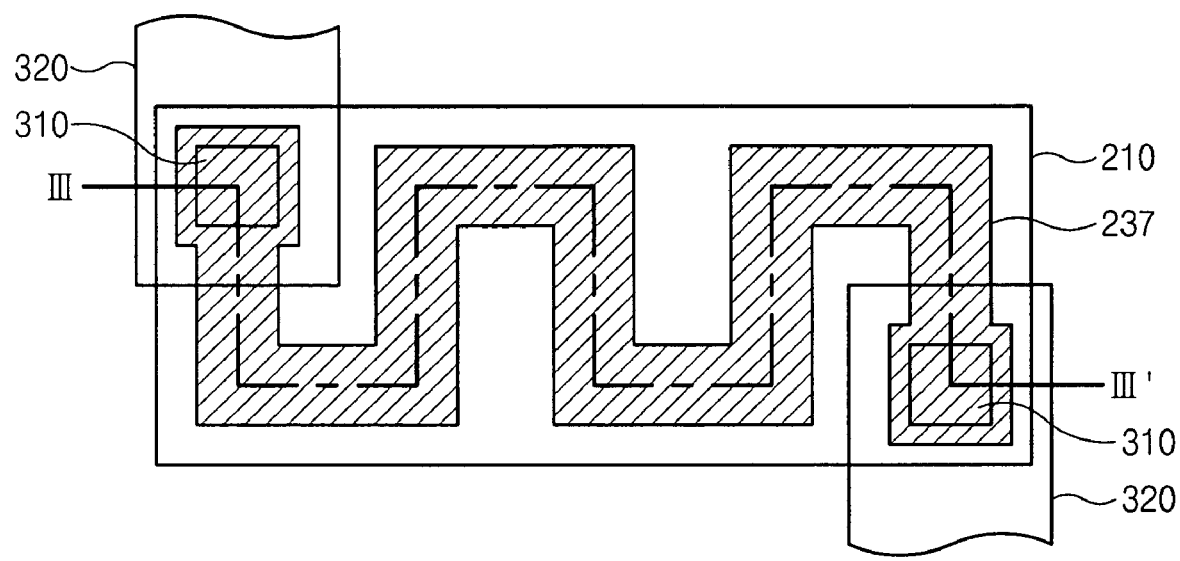
Figure 13C:
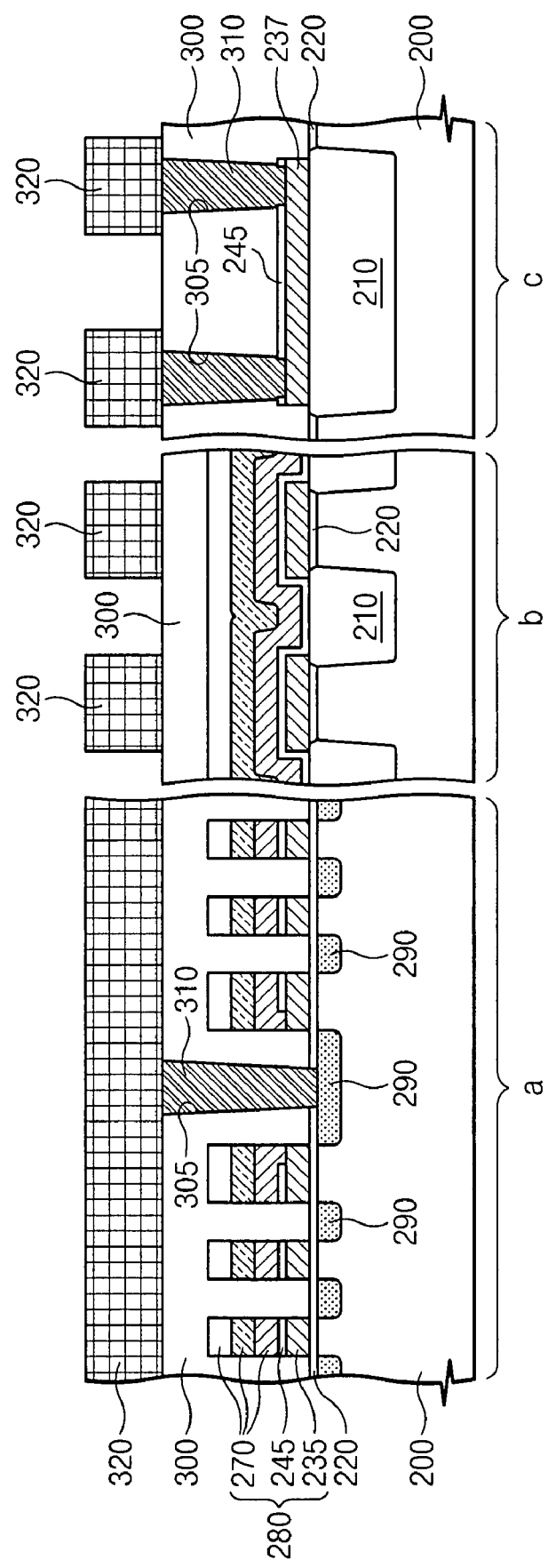

Referring now to FIGS. 13A, 13B, and 13C, an ion implantation process is performed so as to form impurity regions 290 in the active region using the cell gate pattern 280 as a mask. Accordingly, the impurity regions 290 are formed between the cell gate patterns 280. The impurity regions 290 may be used as source/drain electrodes of a transistor. The ion implantation process may be performed before removing the second mask pattern.

An interlayer dielectric layer 300 is formed on a resultant structure having the impurity regions 290. The interlayer dielectric layer 300 may comprise silicon oxide, silicon nitride, and/or silicon oxynitride. A process for forming the interlayer dielectric layer 300 may include a planarizing process such as, for example, a chemical-mechanical polishing (CMP) process.

The interlayer dielectric layer 300 is patterned to form contact holes 305 that penetrate the interlayer dielectric layer 300. The contact hole 305 exposes a predetermined region of the impurity region 290 in the cell array region and also exposes a top surface of the resistor pattern 237 in the resistor region. The contact hole 305 formed on the resistor pattern 237 may be formed over the second opening 242 in accordance with some embodiments of the present invention.

A plug conductive layer is formed on a resultant structure having the contact hole 305. The plug conductive layer is etched until a top surface of the interlayer dielectric layer 300 is exposed. Accordingly, the contact holes 305 are filled by plug patterns 310 connecting an upper surface of the impurity region 290 with the resistor pattern 237.

According to some embodiments of the present invention, the plug patterns 310 may be formed using the same materials as the first conductive pattern 230. In accordance with some embodiments of the present invention, it may be possible to reduce increases in resistance between the plug pattern 310 and the resistor pattern 237 caused by a contact being made of a different kind of material. According to some embodiments of the present invention, the plug pattern 310 and the resistor pattern 237 comprise polysilicon.

An interconnection layer is formed on a resultant structure having the plug pattern 310. The interconnection layer may comprise one or more metallic materials including aluminum, copper, tungsten, titanium, titanium nitride, tantalum, and/or tantalum nitride. The interconnection layer is patterned to form an interconnection 320 connecting the plug patterns 310. The interconnection 320 crosses over the cell gate patterns 280 in the cell array region.

Referring now to FIG. 13C to describe a semiconductor device having a resistor according to some embodiments of the present invention, a device isolation layer 210 is located on a predetermined region of a semiconductor substrate 200. The semiconductor substrate 200 may be divided into a cell array region, a resistor region, and a peripheral circuit region by the device isolation layer 210.

A plurality of cell gate patterns 280 is located in the cell array region, and impurity regions 290 are located between the cell gate patterns 280. A gate insulation layer 220 is located between the cell gate pattern 280 and the semiconductor substrate 200. The gate insulation layer 220 may comprise silicon oxide.

An interlayer dielectric layer 300 having a contact hole 305 is formed on the surface of a semiconductor substrate where the cell gate pattern 280 is formed. The contact hole 305 exposes the impurity region 290 in a predetermined region. An interconnection 320 is located on the interlayer dielectric layer 300 to connect with the contact hole 305. A plug pattern 310 is formed on the contact hole 305 for connecting the impurity region 290 with the interconnection 320.

The cell gate pattern 280 comprises a lower gate pattern 235, a gate interlayer dielectric layer 240, and an upper gate pattern 270, which are sequentially stacked. The lower gate pattern 235 may comprise polysilicon, and the gate interlayer dielectric layer 240 may comprise a silicon oxide layer, a silicon nitride layer, and/or a silicon oxide layer in accordance with some embodiments of the present invention. The upper gate pattern 270 may comprise a second conductive pattern 255 and a capping insulation pattern 265. The second conductive pattern 255 may comprise one or more conductive materials including polysilicon, tungsten, tungsten silicide, cobalt silicide, and/or copper in accordance with some embodiments of the present invention. The capping insulation pattern 265 may comprise silicon oxide, silicon nitride, and/or silicon oxynitride. According to some embodiments of the present invention, the second conductive pattern 255 comprises a lower second conductive pattern 257 formed of polysilicon and an upper second conductive pattern 259 formed of tungsten.

The resistor region corresponds to a region where a resistor is located and generally is formed on the device isolation layer 210. The resistor may comprise a resistor pattern 237 and terminals electrically connected to both ends of the resistor pattern 237. According to some embodiments of the present invention, the plug pattern 310 connected to the impurity region is used as the terminal. That is, a terminal for the resistor may be formed using the same material(s) as the plug pattern 310. The same material means a material(s) that results from a common process and will be understood to be a material(s) having approximately the same chemical composition and shape characteristic (e.g., a thickness).

Furthermore, according to some embodiments of the present invention, the resistor pattern 237 is also formed using the same material(s) as the lower gate pattern 235 of the cell array region. Accordingly, the resistor pattern 237 may also formed using polysilicon as is the lower gate pattern 235. In addition, the resistor pattern 237, the plug pattern 310, and the terminal may be formed using the same material(s), such as, for example, polysilicon. As a result, it may be possible to reduce a variation of a contact resistance that may be induced between the plug pattern 310 and the resistor pattern 237.

According to some embodiments of the present invention, a plug pattern located on a resistor pattern may comprise the same material(s) as the resistor pattern. Accordingly, a variation of a contact resistance generated at the interface of the plug pattern and the resistor pattern may be reduced. That is, even if the resistor pattern is formed thinly as is sometimes done in highly integrated semiconductor devices, an electrical resistance between the plug pattern and the resistor pattern may not be affected by variations in physical contact area. The reason for this is that the plug pattern and the resistor pattern may be formed using the same material(s). As a result, irrespective of an etching depth associated with a process for forming an opening, a semiconductor device resistor may be formed having relatively stable electrical characteristics.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

The invention claimed is:

1. A method of forming an integrated circuit device, comprising:
   forming a resistor pattern on a substrate;
   forming an interlayer dielectric layer on the resistor pattern;
   patterning the interlayer dielectric layer to form at least one opening exposing the resistor pattern; and
   forming a plug pattern that fills the at least one opening, wherein the plug pattern and the resistor pattern are comprised of a same material
   wherein forming the resistor pattern comprises:
   forming a device isolation layer that defines a cell array region and a resistor region in the substrate;
   forming a gate insulation layer on the cell array region;
   forming a first conductive layer on the gate insulation layer and the substrate;
   patterning the first conductive layer to form a first conductive pattern, the first conductive pattern exposing the device isolation layer;
   forming a gate interlayer dielectric layer on the first conductive pattern that has at least one opening that exposes a top surface of the first conductive pattern;
   forming a second conductive layer on the gate interlayer dielectric layer; and
   patterning the second conductive layer, the gate interlayer dielectric layer and the first conductive pattern to form a cell gate pattern and the resistor pattern in the cell array region and the resistor region, respectively.

2. The method of claim 1, wherein the first conductive layer and the plug pattern are comprised of a same material.

3. The method of claim 2, wherein the first conductive layer and the plug pattern comprise polysilicon.

4. The method of claim 1, wherein patterning the second conductive layer, the gate interlayer dielectric layer and the first conductive pattern to form the cell gate pattern and the resistor pattern in the cell array region and the resistor region, respectively, comprises:
   patterning the second conductive layer to form an upper gate pattern that exposes the gate interlayer dielectric layer;
   forming a mask pattern on the resultant structure having the upper gate pattern such that the mask pattern covers a portion of the resistor region so as to define the resistor pattern and expose the cell array region; and
   sequentially etching the gate interlayer dielectric layer and the first conductive layer using the mask pattern and the upper gate pattern as an etching mask.

5. The method of claim 4, wherein patterning the second conductive layer to form the upper gate pattern comprises:
   removing the second conductive layer in the resistor region.

6. The method of claim 1, wherein the first conductive pattern is formed on an active region of the cell array region to expose the device isolation layer and covers a surface of the resistor region.

7. The method of claim 1, wherein forming the gate interlayer dielectric layer comprises:
   forming the gate interlayer dielectric layer on a resultant structure having the first conductive pattern; and
   patterning the gate interlayer dielectric layer to form at least one opening that exposes the top surface of the first conductive pattern.

8. The method of claim 1, wherein the second conductive layer comprises polysilicon, tungsten, tungsten silicide, cobalt silicide, and/or copper.

9. A method of forming an integrated circuit device, comprising:
   forming a device isolation layer in a substrate to define an active region;
   forming a first conductive layer on the substrate including the device isolation layer;

forming a gate interlayer dielectric layer on the first conductive layer, the gate interlayer dielectric layer having openings that expose a top surface of the first conductive layer;

forming a second conductive layer on a resultant structure having the gate interlayer dielectric layer;

patterning the second conductive layer, the gate interlayer dielectric layer, and the first conductive layer to form cell gate patterns and a resistor pattern in a cell array region and a resistor region, respectively;

forming an impurity region in the active region between the cell gate patterns; and forming plug patterns connected to the impurity region and the resistor pattern, wherein the plug patterns and the first conductive layer are comprised of a same material.

10. The method of claim 9, further comprising the following before forming the gate interlayer dielectric layer:

patterning the first conductive layer to form a first conductive pattern on the active region of the cell array region that exposes the device isolation layer and covers a surface of the resistor region.

11. The method of claim 9, wherein the gate interlayer dielectric layer comprises silicon oxide, silicon nitride and silicon oxide, which are sequentially stacked.

12. The method of claim 9, wherein the second conductive layer comprises polysilicon, tungsten, tungsten silicide, cobalt silicide, and/or copper.

13. The method of claim 9, wherein patterning the second conductive layer, the gate interlayer dielectric layer, and the first conductive layer to form the cell gate patterns and the resistor pattern comprises:

patterning the second conductive layer to form an upper gate pattern, the upper gate pattern exposing the gate interlayer dielectric layer;

forming a mask pattern on the resultant structure having the upper gate pattern, wherein the mask pattern covers a portion of the resistor region so as to define the resistor pattern and exposes the cell array region; and sequentially etching the gate interlayer dielectric layer and the first conductive layer using the mask pattern and the upper gate pattern as an etching mask.

14. The method of claim 13, wherein forming the upper gate pattern comprises removing the second conductive layer in the resistor region.

15. The method of claim 9, wherein the plug pattern and the first conductive layer comprise polysilicon.

16. The method of claim 9, wherein forming the plug patterns comprises:

forming an interlayer dielectric layer on a resultant structure having the impurity region;

patterning the interlayer dielectric layer to form openings that expose a top surface of the impurity region and ends of the resistor pattern;

forming a plug conductive layer on the interlayer dielectric layer so as to fill the openings in the interlayer dielectric layer; and etching the plug conductive layer until the interlayer dielectric layer is exposed.

* * * * *

UNITED STATES PATENT AND TRADEMARK OFFICE
CERTIFICATE OF CORRECTION

| | |
|---|---|
| PATENT NO. | : 7,186,617 B2 |
| APPLICATION NO. | : 10/880919 |
| DATED | : March 6, 2007 |
| INVENTOR(S) | : Lee et al. |

It is certified that error appears in the above-identified patent and that said Letters Patent is hereby corrected as shown below:

On The Title Page,
Foreign Application Priority Data:
Item [30] Please correct "Apr. 8, 2006 (KR)...10-2004-0024206"
to read --Apr. 8, 2004 (KR)...10-2004-0024206--

Signed and Sealed this

Twenty-ninth Day of May, 2007

JON W. DUDAS
*Director of the United States Patent and Trademark Office*